(12) United States Patent
Van Schuylenbergh et al.

(10) Patent No.: US 6,621,141 B1
(45) Date of Patent: Sep. 16, 2003

(54) OUT-OF-PLANE MICROCOIL WITH GROUND-PLANE STRUCTURE

(75) Inventors: Koenraad F. Van Schuylenbergh, Sunnyvale, CA (US); Christopher L. Chua, San Jose, CA (US); David K. Fork, Los Altos, CA (US)

(73) Assignee: Palo Alto Research Center Incorporated, Palo Alto, CA (US)

(*) Notice: Subject to any disclaimer, the term of this patent is extended or adjusted under 35 U.S.C. 154(b) by 0 days.

(21) Appl. No.: 10/201,094

(22) Filed: Jul. 22, 2002

(51) Int. Cl.[7] ............................ H01L 29/00; H01L 29/80
(52) U.S. Cl. ........................ 257/531; 257/528; 257/277; 257/516
(58) Field of Search ................................. 257/528, 531, 257/277, 516; 336/200, 232, 186, 187; 333/185

(56) References Cited

U.S. PATENT DOCUMENTS

| | | | |
|---|---|---|---|
| 3,842,189 A | 10/1974 | Southgate | |
| 4,821,148 A | 4/1989 | Kobayashi et al. | |
| 5,613,861 A | 3/1997 | Smith et al. | |
| 6,194,774 B1 | 2/2001 | Cheon | |
| 6,249,039 B1 * | 6/2001 | Harvey et al. | 257/531 |
| 6,392,524 B1 | 5/2002 | Biegelsen et al. | |
| 6,455,885 B1 * | 9/2002 | Lin | 257/300 |

OTHER PUBLICATIONS

Zou et al., Plastic Deformation Magnetic Assembly (PDMA) of Out–of–Plane Microstructures: Technology and Application, Journal of Microelectromechanical Systems, vol. 10, No. 2, Jun. 2001, pp. 302–309.

Nguyen et al., A 1.8–GHz Monolithic LC Voltage–Controlled Oscillator, IEEE Journal of Solid State Circuits, vol. 27, No. 3, Mar. 1992, pp. 444–450.

Young et al., "A Low–Noise RF Voltage–Controlled Oscillator Using On–Chip High–Q Three–Dimensional Coil Inductor and Micromachined Variable Capacitor", Solid–State Sensor and Actuator Workshop, Jun. 8–11, 1998, pp. 128–131.

Craninckx et al., "FA 15.5: A CMOS 1.8GHz Low–Phase–Noise Voltage–Controlled Oscillator With Prescaler", 1995 IEEE International Solid–State Circuits Conference, Feb. 1995, pp. 265–268.

Chang et al., "Large Suspended Inductors On Silicon and Their Use In A 2–um CMOS RF Amplifier", IEEE Electron Device Letters, vol. 14, No. 5, May 1993.

Young et al., "Monolithic High–Performance Three–Dimensional Coil Incutors For Wireless Communication Applications", Dept. of Electrical Engineering and Computer Sciences, Lawrence Livermore National Laboratory, pp. 3.5.1–3.5.4.

(List continued on next page.)

*Primary Examiner*—Minh Loan Tran
*Assistant Examiner*—Tan Tran
(74) *Attorney, Agent, or Firm*—Bever, Hoffman & Harms, LLP; Patrick T. Bever (57) ABSTRACT

Patterned ground planes are formed between out-of-plane microcoil structures and underlying integrated circuits (ICs). Each out-of-plane coil includes a series of loops extending from base (contact) pads formed on a dielectric layer (e.g., thick IC passivation, or BCB formed on thin passivation). Losses due to capacitive coil-to-substrate coupling are minimized using a central ground plane structure located under the base pads of the microcoil. Magnetic losses are reduced by forming a low-resistance ground plane structure including end portions located outside of the ends of the microcoil. The low-resistance ground plane can be slotted to reduce the loop size of eddy current pathways. The low-resistance ground plane is formed from one or more of the top IC metal layers, copper pads formed between the IC passivation and the dielectric, portions of the metal used to form the microcoil, or combinations thereof.

21 Claims, 8 Drawing Sheets

OTHER PUBLICATIONS

Kim et al., "Realization of High-Q Inductors Using Wire-bonding Technology", School of Electronics Engineering, Ajou University, 4 pages.

Larson, "RF and Microwave Circuit Design For Wireless Communications", 1997 Artech House, Inc., pp. 272–273, 366–367, 368–369, 384–385.

Nguyen et al., "Si IC–Compatible Inductors and LC Passive Filters", IEEE Journal of Solid–State Circuits, vol. 25, No. 4, Aug. 1990, pp. 1028–1031.

Rogner et al., "The LIGA technique—what are the new opportunities", J. Micromech. Microeng. 2 (1992) 133–140.

* cited by examiner

OUT-OF-PLANE MICROCOIL WITH GROUND-PLANE STRUCTURE

FIELD OF THE INVENTION

This invention generally relates to integrated circuits, and more particularly to integrated circuits (ICs) including on-chip inductors.

DISCUSSION OF RELATED ART

Low-loss on-chip inductors (i.e., that are integrated on an IC substrate) are desirable in wireless communication devices such as cellular phones, pagers, GPS receivers, warehouse management RF identification tags, wireless computer local area networks (WLANs), personal digital assistants, and satellite telecommunication. Small portable devices, in particular, require the lowest possible power consumption for extended battery life and a maximal circuit integration to reduce device size and PC board complexity. The quest for low-loss inductors is driven by a fundamental trade-off between power consumption on one hand and the need for low-loss circuit passives (i.e., inductors and capacitors) on the other. Lowering the transistor bias in radio circuits reduces the power dissipation, but also significantly degrades amplifier gains, oscillator stability and filter selectivity. Using low-loss passives is the only viable technique to overcome this problem. However, many state-of-the art integrated coil architectures are still too lossy to be of use in integrated RF designs. Most present RF chipsets, therefore, are limited to using discrete inductors that take up valuable board space and increase board complexity. In addition, connections must be provided between an IC device and the discrete inductors, thereby requiring an IC package with a higher pin count (i.e., to support a connection between the IC device and the discrete inductors) than that required if the inductors were integrated (i.e., fabricated directly on) the IC device. Higher pin count IC packages are typically larger and more expensive than lower pin count packages.

Accordingly, the integration of small inductors on silicon substrates has been the subject of intense worldwide research for many years. The structures proposed so far, however, have been variations of devices in which, due to technological constraints, the coil windings have almost always been implemented as spirals parallel to the underling substrate.

Figures 22, 23:
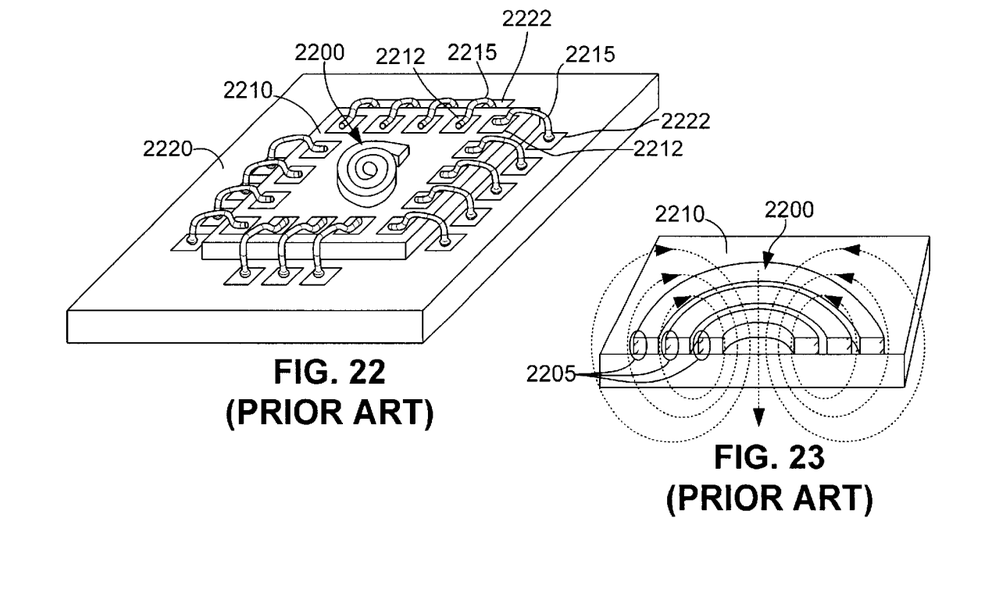
FIG. 22 is a perspective view showing an IC device including a conventional in-plane coil structure.
FIG. 23 is a perspective view showing magnetic fields generated by the conventional in-plane coil structure.

FIG. 22 is a perspective view showing a simplified in-plane spiral coil winding 2200 formed on an IC substrate 2210, which in turn is mounted on a package or printed circuit board (PCB) 2220. Note that coil winding 2200 is substantially disk-shaped, and lies in a plane that is parallel to the upper surface of substrate 2210. Contact pads 2212, which are formed on the upper surface of IC substrate 2210, are connected by conventional bonding wires 2215 to corresponding pads 2222 formed on package/PCB 2220.

FIG. 23 is a perspective cut-away view showing a portion of in-plane coil winding 2200 and indicating the magnetic fields (i.e., dashed lines) generated in the vicinity of coil winding 2200 during operation. This figure illustrates two major drawbacks of in-plane coil winding 2200. First, when substrate 2210 is conducting, such as silicon, the coil magnetic fields (dashed lines in FIG. 23) induce eddy currents in underlying substrate 2210. These currents cause resistive dissipation that contributes to the coil losses. The second problem arises when coil winding 2200 is operated at high frequencies, where skin and proximity effects force the coil current to flow along the outer surfaces A05 of coil winding 2200 (as indicated by shaded regions located at the outer edges of coil winding 2200). The "skin depth" is about 2 to 3 microns for typical conductors at frequencies of interest for wireless communication, for example, 900 MHz, 1.9 GHz and 2.4 GHz. The AC resistance of the coil conductor becomes appreciably higher than its DC resistance because the cross section of the conductor is not fully used.

Solutions have been proposed and tried in the past to address the drawbacks associated with in-plane inductors. Eddy currents can be reduced, for example, by etching away the substrate underneath the coil. However, this approach is not practical as it sacrifices structural integrity and impedes placing electronic circuitry on the substrate underneath the coil, thereby wasting expensive silicon real estate. As coil quality factor fundamentally scales with the coil dimensions, coils tend to be much larger than the other circuit components. To reduce the AC resistance of the device in FIG. 23, the conductor can be made very thick using micromachining techniques such as LIGA (see "The LIGA Technique—What are the New Opportunities", A. Rogner et al., J. Micromech. Microeng., vol. 2, 1992, pages 133–140). However, processing high aspect ratio structures is difficult and expensive.

Various out-of-plane techniques have been suggested that address the induced current eddy problems of in-plane coil: structures. One such out-of-plane miniature coil structure that can be used as an on-chip inductor is disclosed in co-owned U.S. Pat. No. 6,392,524, entitled "Photolithographically-patterned out-of-plane coil structures and method of making". The coil structure includes a lithographically produced elastic member having an intrinsic stress profile that is formed on the IC substrate. An anchor portion remains fixed to the substrate. The free portion end becomes a second anchor portion that may be connected to the substrate via soldering or plating. Alternately, the loop winding can be formed of two elastic members whose free ends are joined in mid-air. A series of individual coil structures can be joined via their anchor portions to form out-of-plane inductors and transformers.

Although out-of-plane coil structures, such as those disclosed in U.S. Pat. No. 6,392,524, reduce capacitive substrate coupling and minimize eddy current induction by taking the bulk of the magnetic fields out of the underlying substrate, the residual magnetic coupling leads to some level of performance degradation that is only avoided with toroidal out-of-plane microcoil structures.

What is needed is an out-of-plane solenoid-type microcoil structure that minimizes performance degradation caused by both capacitive substrate coupling and eddy current induction.

SUMMARY

The present invention is directed to integrated circuit (IC) devices including an out-of-plane solenoid-type microcoil structure formed over an IC substrate, wherein one or more ground plane structures are provided on the IC device to reduce losses caused by capacitive coupling of the microcoil structure to the IC substrate, and to reduce magnetic losses due to eddy currents generated in the IC substrate by magnetic fields produced by the microcoil structure.

Each out-of-plane solenoid-type microcoil structure is formed on a suitable dielectric layer (e.g., Benzocyclobutene: (BCB) formed on passivation, or a relatively thick passivation layer), which in turn is formed over the IC structure. The microcoil structure includes several base (contact) portions that are formed on the upper surface of the dielectric layer, and several loop structures extending over the dielectric layer and connecting the base pads in series. Contact pads located at each end of the microcoil are connected by via structures extending through the dielectric layer to the underlying IC structure.

In accordance with a first aspect of the present invention, the ground plane structure is formed directly under the base pads of the microcoil to minimize capacitive coupling between the microcoil loop structures and the IC substrate. In one embodiment, the ground plane structure is formed using the top metal layer of the underlying IC structure. In another embodiment, the ground plane structure is formed using a low-resistance plated layer (e.g., copper) formed on the upper passivation layer of the IC substrate (i.e., between the passivation layer and a separate dielectric film upon which the microcoil is formed). In either embodiment, a width of the ground plane structure may be less than a diameter defined by the microcoil loop structures.

In accordance with a second aspect of the present invention, a low-resistance ground plane structure is provided between the passivation layer and the separate dielectric film of the dielectric layer, and extends past the end loop structures of the microcoil to reduce eddy current dissipation in the underlying IC substrate. In one embodiment, the ground plane structure comprises a sheet of low-resistance material (e.g., copper) that is formed between the upper passivation layer and the dielectric film, and has a peripheral boundary that extends well beyond the sides and ends of the microcoil, thereby allowing eddy currents to run freely without causing significant losses and minimizing magnetic coupling between the microcoil and the IC substrate. In another embodiment, the ground plane structure is slotted in a direction parallel to the microcoil axis to reduce the loop size of eddy current pathways induced by the microcoil. In another embodiment, the ground plane structure is "I" shaped, and includes end sections extending beyond the ends of the microcoil to reduce eddy currents, and a narrow section extending under the base pads between the end sections to reduce capacitive coupling.

The present invention is applicable to any of several out-of-plane solenoid-type microcoil structures, including microcoil structures in which both the base pads and loop structures are formed from a stress-engineered spring metal film (i.e., a metal film intentionally formed with an internal stress gradient), microcoil structures formed using wire bonding techniques to connect base pad traces formed on the dielectric layer, and planar spiral inductors that are mechanically lifted out of the substrate plane. In one embodiment, the spring metal film is etched to form spaced-apart (offset) islands, each island including a central base pad and two fingers extending in opposite directions away from the base pad. A release material located between the spring metal film and dielectric layer is then removed (e.g., etched) from beneath the fingers (the base pads are masked to prevent release). The released fingers then bend upward into half-loop structures, and a finger associated with one island couples with the finger associated with another island. In another embodiment, a spring metal film is etched to form spaced-apart (offset) islands, each island including a base pad and a single finger extending away from the base pad. The release material is then removed to release the finger, and the released fingers bends into a helical shape such that its free end contacts an adjacent base pad. In yet another embodiment, microcoil structures are formed by wire bonding conductive traces formed on the dielectric layer, each trace having first and second spaced-apart contact pads, and an elongated interconnect line located between the first and second contact pads. The wire bonding places bonding wires such that each wire extends from a first contact pad of a first trace over the substrate surface to a second contact pad of a second trace, thereby forming a coil-like structure.

In accordance with yet another aspect of the present invention, a multi-part ground plane structure includes a central portion formed under the base pads according to the first aspect to minimize losses due to capacitive microcoil/substrate coupling, and end portions formed outside of the ends of the microcoil to minimize eddy current dissipation. In one embodiment, the central portion is formed using the top metal of the IC substrate, and the end portions are formed by metal used to produce the microcoil. For example, when the microcoil structures are formed using a stress-engineered spring metal film, the end portions of the ground plane structure are formed from un-released portions of the stress-engineered spring metal film. Alternatively, when the microcoil structures are formed using bonding wires, the end.portions are formed by the metal layer used to form the base pad traces.

The present invention will be more fully understood in view of the following description and drawings.

DETAILED DESCRIPTION

Figure 1:
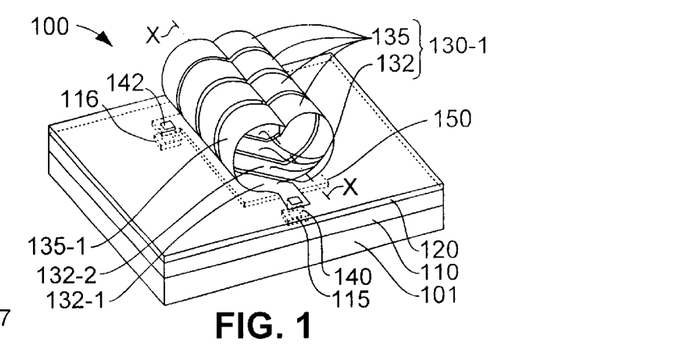
FIG. 1 is a perspective view showing an IC device including an out-of-plane solenoid-type microcoil structure according to an embodiment of the present invention.
Figure 2:
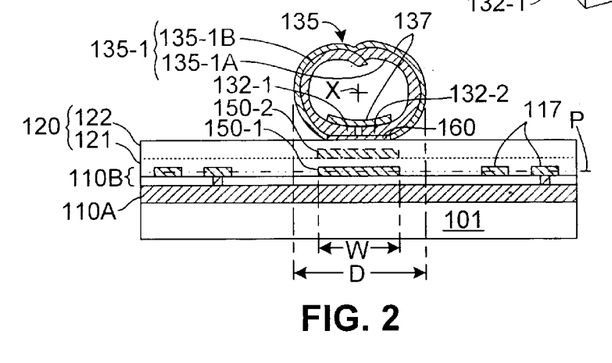
FIG. 2 is a cross-sectional side view showing the IC device of FIG. 1.

FIGS. 1 and 2 are perspective and cross-sectional side views, respectively, showing a simplified integrated circuit (IC) device 100 according to an embodiment of the present invention. IC device 100 includes a semiconductor substrate 101 having an integrated circuit (IC) 110 formed thereon according to known techniques, a dielectric layer 120 formed over IC 110, and a microcoil structure 130-1 formed on dielectric layer 120.

Referring to FIG. 2, IC 110 includes a lower device region 110A made up of transistors and other devices formed by doped regions and associated connection structures that are lithographically fabricated in the surface of substrate 101 according to known techniques, and an upper metallization layer 110B including a network of metal wires 117 that connect selected portions of the doped regions, also according to known techniques. Note that metal wires 117 are typically formed by depositing (e.g., sputtering) a metal film onto an insulator, and then etching the metal film to form desired wire patterns. Accordingly, the metal wires etched from a particular metal film typically define a plane. For example, as shown in FIG. 2, wires 117, which represent wires formed from the uppermost (top metal) layer, define a plane P. Metal wires 117 are typically formed from aluminum, but may also be copper.

Dielectric layer 120 includes an upper passivation (insulation) layer 121, which is typically formed over uppermost wires 117 to protect the underlying metallization layer 110B, and an optional, relatively thick (e.g., 10 to 15 microns) dielectric film 122 made of a suitable dielectric material, such as Benzocyclobutene (BCB). One function of dielectric layer 120 is to maintain microcoil structure 130-1 at a suitable distance from IC 110. Conventional upper passivation layers are typically too thin to provide a suitable spacing between wires 117 and microcoil structure 130-1, and hence the separate dielectric film 122 is needed over such conventional passivation layers. However, separately formed dielectric film 122 may be omitted if upper passivation layer 121 is made sufficiently thick. Therefore, unless otherwise specified in the embodiments described below, the term "dielectric layer" is intended to mean either a relatively thick upper passivation layer that facilitates formation of the microcoil directly thereon, or a relatively thin passivation layer with a separately formed dielectric film formed thereon.

As indicated in FIG. 1, microcoil structure 130-1 is formed on dielectric layer 120, and includes spaced-apart base pads 132 that are located adjacent to the upper surface of dielectric layer 120, and curved loop structures 135 that bend away from dielectric layer 120 to collectively form a roughly helical coil defining a central longitudinal axis X. Note that although the longitudinal axes of the solenoid-type microcoil structures disclosed herein are substantially straight, solenoid-type microcoil structures can be similarly formed that define curved or serpentine axes. Each base pad 132 contacts an upper surface of dielectric layer 120, or contacts a thin layer of material (e.g., "release" material, which is described below) that is formed on dielectric layer 120. For example as indicated in FIG. 2, base pads 132-1 and 132-2 are formed on release material pad 160. In the present embodiment, each loop structure 135 (e.g., loop structure 135-1) includes a first arm (e.g., arm 135-1A) and a second arm (e.g., arm 135-1B) that meet (contact) each other at the top of the loop structure. As described in additional detail below, each arm is integrally formed with an associated base pad such that the resulting loop structure 135 forms a closed circuit path between adjacent base pads 132. For example, as indicated in both FIG. 1 and FIG. 2, arm 135-1A has a first (fixed) end integrally formed with first base pad 132-1, and arm 135-1B has a first (fixed) end integrally formed with second base pad 132-2. Free ends of arms 135-1A and 135-1B meet (contact) at the top of the loop (e.g., over base pads 132-1 and 132-2) in the manner described below. Each loop structure is formed using a conductive material (e.g., metal or metal plate) that facilitates current flow through the series of base pads 132 and loop structures 135. In one embodiment, a plated metal 137 is formed on the outside surface of arms 135-1A and 135-1B, and is also formed on base pads 132-1 and 132-2 to facilitate low-resistance current flow through microcoil 130-1. In addition, base pads located at the ends of microcoil structure 130-1 (e.g., base pad 132-1) are connected to IC 110 by metal via structures (e.g., via structure 140 and conductor/wire 115) that pass through dielectric layer 120. Accordingly, microcoil structure 130-1 forms an inductor that is utilized by IC 110.

Figure 3:
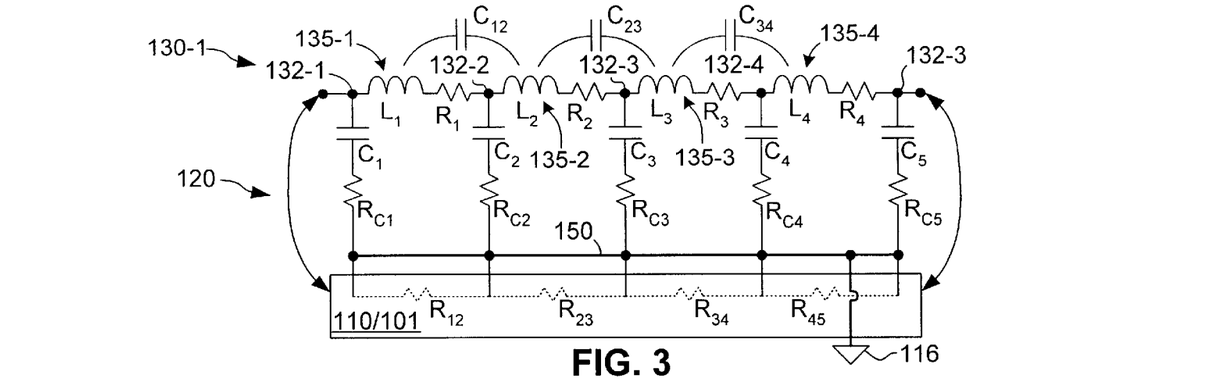
FIG. 3 is a simplified circuit diagram depicting an effective circuit formed by the IC device of FIG. 1.

FIG. 3 is a circuit diagrams depicting the effective circuit generated by microcoil structure 130-1 and IC 110. FIG. 3 shows how each loop of microcoil structure 130-1 can be represented by its inductance $L_i$, its magnetic coupling to all the other windings (not shown), its frequency-dependent winding resistance $R_i$, the parasitic interwinding capacitances $C_{i(i\pm1)}$ to its neighbors, its capacitance $C_i$ to the underlying substrate and the dielectric losses $R_{Ci}$ in the underspring dielectric. For example, loop structure 135-1 can be represented by inductance $L_1$, frequency-dependent winding resistance $R_1$, parasitic interwinding capacitances $C_{12}$ to neighboring loop structure 135-2, capacitance $C_1$ to IC 110 and substrate 101 (collectively referred to as IC substrate 110/101), and the dielectric losses $R_{C1}$ in dielectric layer 120. Similarly, loop structure 135-2 can be represented by inductance $L_2$, frequency-dependent winding resistance $R_2$, parasitic interwinding capacitances $C_{23}$ to neighboring loop structure 135-3, and capacitance $C_2$ resistance $R_{C2}$. Dielectric losses in the coil encapsulation add resistors in series with the interwinding capacitances $C_{i(i\pm1)}$ that are omitted in FIG. 3 for clarity. Substrate resistances $R_{i(i\pm1)}$ (e.g., $R_{12}$) are produced by the conduction in the substrate 101 (see FIG. 3). The toplayer 110A is most likely dominating the resistors $R_{i(i\pm1)}$ as it is typically more heavily doped than the substrate bulk. Note that the substrate capacitance ($C_i$) can be approximated by the capacitance of contact pads 132 because loop structures 135 are further away from IC substrate 110/101. Note also that the substrate capacitances $C_i$ dominate over the interwinding capacitances $C_{i(i\pm1)}$, because the facing areas are much larger and the underspring dielectric is typically much thinner than the interwinding gap. The dielectric losses in the coil encapsulation can be ignored for the same reason. As described in additional detail below, a ground plane 150 is provided to short substrate resistances $R_{i(i\pm1)}$, thereby providing a remedy to the capacitive losses.

Figure 4:
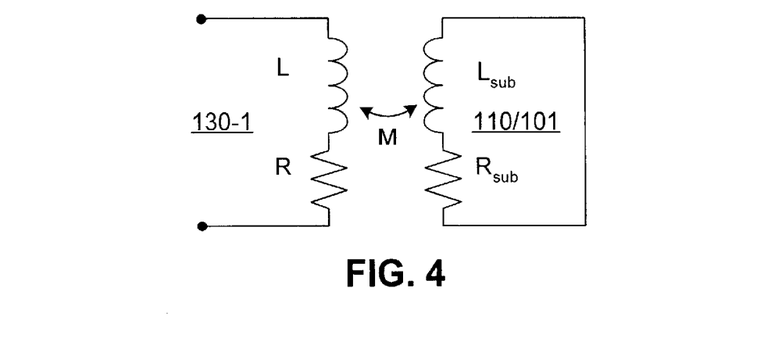
FIG. 4 is a simplified circuit diagram depicting the effective circuit of FIG. 3.

Eddy currents that are induced by microcoil structure 130-1 in nearly conductors (e.g., wires 117 or other conductors associated with IC substrate 110/101) are not shown in FIG. 3. FIG. 4 is a simplified circuit diagram depicting IC substrate 110/101 as a shorted lossy inductance (i.e., $R_{sub}$ and $L_{sub}$) that is magnetically coupled to microcoil structure 130-1. Equations 1 and 2 (below) indicate the effective resistance $R_{eff}$ and effective inductance $I_{eff}$ of this circuit. Equations 1 and 2 (below) show that the IC substrate coupling reduces the effective inductance and increases the coil resistance.

$$R_{eff} = R + R_{sub}\left(\frac{\omega^2 M^2}{R_{sub}^2 + \omega^2 L_{sub}^2}\right) \quad (1)$$

$$L_{eff} = L - L_{sub}\left(\frac{\omega^2 M^2}{R_{sub}^2 + \omega^2 L_{sub}^2}\right) \quad (2)$$

Based on the above analysis and associated experimentation, the present inventors have determined that the several mechanisms cause magnetic losses and power dissipation in the underlying IC substrate when driving AC currents through out-of-plane solenoid-type microcoils, such as microcoil structure 130-1, and hence lower the quality factor of such microcoils. For example, dissipation is caused by resistive losses due to substrate eddy currents, resistive losses due to IC substrate currents that couple through the capacitors $C_i$ (see FIG. 3, note that these currents are due to electrical substrate coupling and are thus different from the magnetically induced eddy currents), dielectric losses in the underspring dielectric, and dielectric losses in the coil encapsulation.

The present inventors have determined that the magnetic losses in the materials surrounding microcoil structure 130-1 can be safely ignored as long as there are no ferrites or similar magnetic materials nearby. As stated before, the dielectric losses in the coil encapsulation can also be ignored because of the small interwinding capacitances $C_{i(i\pm1)}$. Finally, the dielectric losses $R_{Ci}$ in dielectric layer 120 are negligible with low loss dielectrics (tan $\delta<<1\%$) and non-metallic substrates where the substrate resistors $R_{i(i\pm1)}$ dominate over dielectric losses $R_{Ci}$.

Accordingly, the present invention provides improved IC devices, such as IC device 100 (FIG. 1), that include an out-of-plane solenoid-type microcoil structure (e.g., microcoil structure 130-1) formed over an IC substrate 110/101, by providing ground plane structures that reduce losses due to capacitive coupling of microcoil structure 130-1 to IC substrate 110/101, and reduce magnetic losses due to eddy currents generated in IC substrate 110/101 by magnetic fields produced by microcoil structure 130-1. Therefore, IC devices formed with ground plane structures in accordance with the present invention maximize the effectiveness of out-of-plane microcoil structures while minimizing losses in the underlying IC substrate.

Referring again to FIGS. 1 and 2, in accordance with a first aspect of the present invention, IC device 100 includes a ground plane structure 150 (indicated in dashed lines) that is located directly below base pads 132. In one embodiment, ground plane structure 150 is electrically isolated (floating) with respect to microcoil structure 130-1 and IC 110. In another embodiment, ground plane structure is connected to a ground (low voltage) source 116 utilized by IC 110. Although thick underspring dielectric layer 120 reduces the microcoil/IC substrate coupling effect, the present inventors have determined that it cannot be avoided completely using only a dielectric layer. The present inventors have determined, however, that dissipation due capacitive substrate coupling can be minimized when ground plane structure 150 is positioned underneath microcoil structure 130-1. In particular, because most of the substrate capacitance $C_i$ is generated by the base pads 132 of microcoil structure 130-1, ground plane structure 150 is efficiently formed when it has a width W that is narrower than an outer diameter D defined by loop structures 135 (as shown in FIG. 2), but may also be wider than outer diameter D (i.e., having a width equal to or larger than the area defined by base pads 132 and the gaps separating the base pads). Referring again to FIG. 3, ground plane 150 effectively shorts together substrate resistances $R_{i(i\pm1)}$, and eliminates associated losses due to capacitive substrate coupling.

Specific embodiments showing the formation of ground plane structure 150 will now be described.

Referring again to FIG. 2, in a first specific embodiment, a ground plane structure 150-1 is formed using the top metal layer utilized in the fabrication of IC 110. That is, assuming metal wires 117 are etched from the top metal layer used to fabricate IC 110, then ground plane structure 150-1 is also etched from this top metal layer at the same time (i.e., during the same etching process), and is therefore typically located in the same plane P defined by metal wires 117. Referring again to FIG. 3, at low frequency, the inductors $L_i$ have low impedance, and current will flow from one terminal to the other straight through the inductors $L_i$ and resistors $R_i$. As the frequency rises, the impedance of that path increases and the impedance of the underspring capacitors $C_i$ decreases. As a result, more and more current will find its way to the other terminal through the substrate where it causes Ohmic dissipation. Ground plane structure 150-1 minimizes this Ohmic dissipation by reducing or eliminating resistance to this high frequency current. An advantage of forming ground plane structure 150-1 from the IC top metal layer is that it does not require an additional metal layer, thus minimizing processing time, and therefore the total cost, of IC device 100.

In a second specific embodiment, a ground plane structure 150-2 (shown in dashed lines in FIG. 2) is formed on passivation layer 121 (i.e., between microcoil structure 130-1 and IC 110). Ground plane structure 150-2 may be formed using aluminum, copper, or a similar low resistance material.

It is noted that capacitive microcoil/IC substrate coupling occurs regardless of the coil design, be it solenoid (e.g., having a substantially linear axis, such as microcoil structure 130-1) or toroid (i.e., having a circular axis). Therefore, ground plane structure 150 can be beneficially utilized in out-of-plane microcoil structures other than those disclosed herein.

In addition, the present invention is applicable to out-of-plane microcoil structures other than spring metal microcoil structure 130-1, which is described above with reference to FIGS. 1 and 2.

Figure 5:
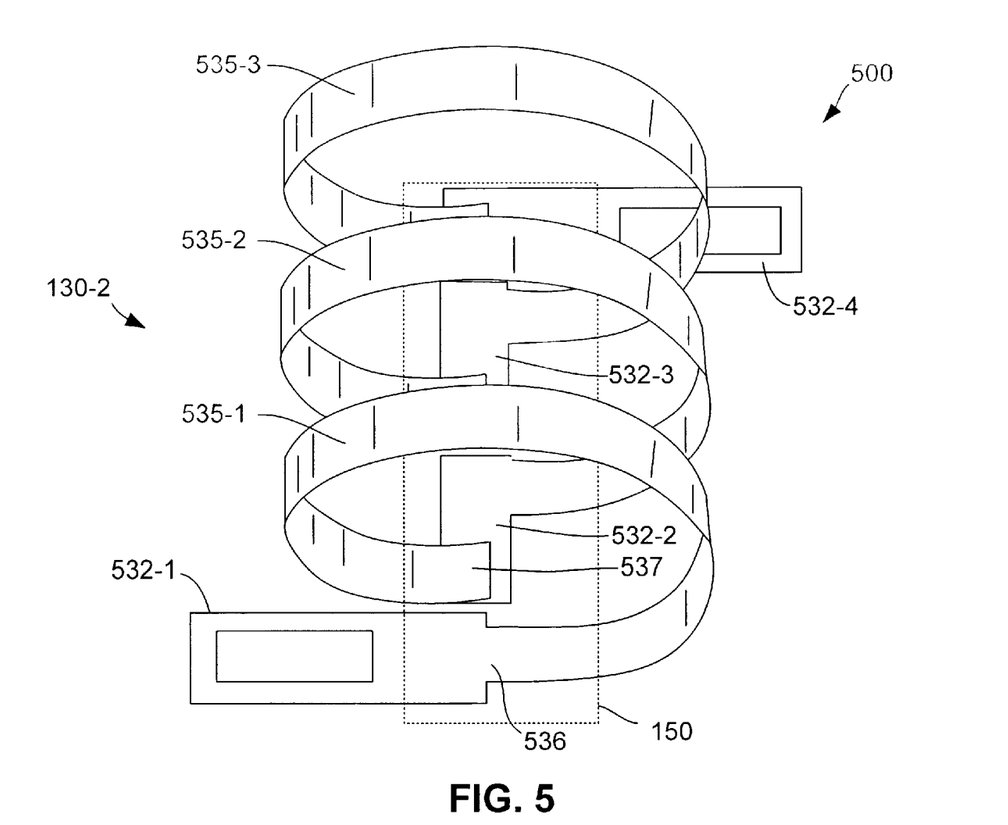
FIG. 5 is a front perspective view showing an out-of-plane solenoid-type microcoil structure according to another embodiment of the present invention.

FIG. 5 is a perspective top view showing an IC device 500 including an out-of-plane microcoil structure 130-2 according to another embodiment of the present invention. Microcoil structure 130-2 is formed over a ground plane structure 150 in a manner similar to that described above (i.e., a dielectric layer (not shown) is formed between second microcoil structure 130-2 and ground plane structure 150; an underlying IC substrate is also omitted for clarity). Second microcoil structure 130-2 includes four spaced-apart base portions 532-1 through 532-4, and three single helical loop structures 535-1 through 535-3. Each loop structures 535-1 through 535-3 is formed from a stress-engineered spring metal, and has a fixed end integrally connected to an associated base pad. For example, loop structure 532-1 is integrally formed at its fixed end 536 to base pad 532-1. During a release process, the inherent internal stress gradient stored of the stress engineered spring metal causes the loop structures to curl (bend) away from the underlying IC substrate with a sufficient degree of helical pitch to jog the free end of the loop structure over to an adjacent base pad. For example, when loop structure 532-1 is released, it curls in a helical fashion such that its free end 537 contacts adjacent base pad 532-2, thereby providing an electrical path between base pads 532-1 and 532-2. Such microspring structures are disclosed in co-owned U.S. Pat. No. 6,392,524, which is incorporated herein by reference.

Figure 6:
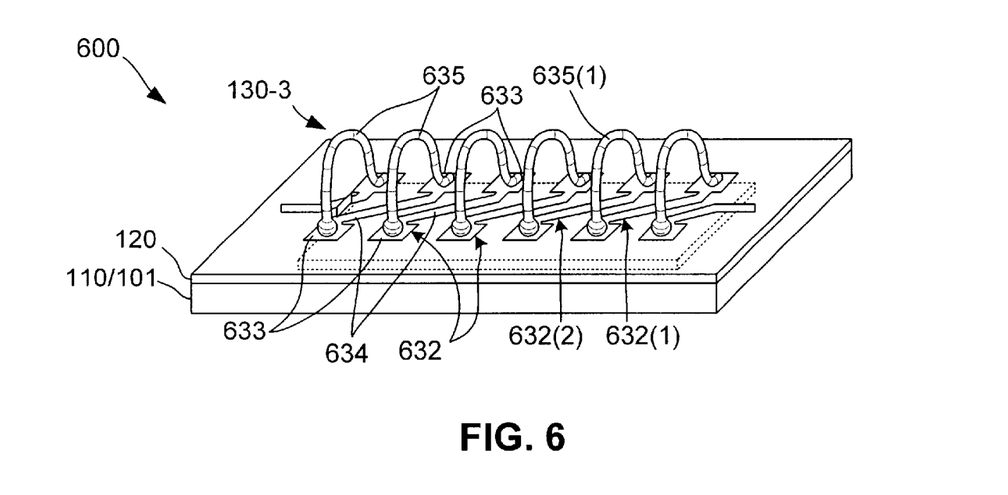
FIG. 6 is a side perspective view showing an out-of-plane solenoid-type microcoil structure according to yet another embodiment of the present invention.

FIG. 6 is a perspective view showing an IC device 600 according to yet another embodiment of the present invention. IC device 600 includes a third type of microcoil structure 130-3 formed over a ground plane structure 150 in a manner similar to that described above. Unlike the previously described microcoil structures, microcoil structure 130-2 does not use a stress-engineered spring metal, but instead utilizes conventionally formed metal traces (base pads) 632 arranged in an offset pattern, and a series of arched wire bonds 635 that connect adjacent metal traces 632 to form a coil-like structure. Conductive traces 632 include first and second spaced-apart contact pads 633, and an elongated interconnect line 634 located between the first and second contact pads. Wire bonding is then performed to place bonding wires 635 such that the wires extend from a selected contact pad of a first trace over the substrate surface to a selected contact pad of a second trace. For example, bonding wire 635(1) extends from a contact pad of a first trace 632(1) to a second contact pad of a second trace 632(2). Inductance is generated during subsequent operation by passing the current through the traces and wires in series.

In addition to the specific microcoil structures described above, the present invention is also applicable to planar spiral inductors that are mechanically lifted out of the substrate plane (see: Zou J., J. Chen, C. Liu and J. E. Schutt-Ainé, "Plastic deformation magnetic assembly (PDMA) of out-of-plane microstructures: technology and application," J. Micro-electromech. Syst., vol. 10, no. 2, pp. 302–309, 2001).

In addition to capacitive substrate coupling (discussed above), another problem associated with out-of-plane solenoid-type microcoil structures is the induction of eddy currents in the underlying conductive IC substrate and metallization that is intersected by the magnetic field lines generated by the out-of-plane microcoil. Although out-of-plane microcoil structures substantially reduce such eddy currents in comparison to conventional in-plane microcoils, the present inventors have determined that losses due to magnetic microcoil/IC substrate coupling still occur in solenoid coil designs (i.e., only toroidal coils completely avoid magnetic fields in the underlying IC substrate).

Accordingly, the present inventors determined that there are two possible approaches to deal with these eddy current losses: avoiding eddy-current induction altogether, or allowing eddy-current induction but minimizing the associated dissipation.

To avoid eddy current dissipation (i.e., reducing the substrate resistance $R_{sub}$), the magnetic fields are allowed to freely induce eddy currents in the underlying IC substrate, but the associated Ohmic losses are minimized by providing a low-resistance ground plane with an as small as possible $R_{sub}$. This is easily understood by modifying Equations 1 and 2 (above) using a value for $R_{sub}$ that is very small (i.e., approaches zero), thereby producing Equations 1' and 2':

$$R_{eff} \approx R \qquad (1')$$

$$L_{eff} \approx L - \frac{M^2}{L_{sub}} \qquad (2')$$

Figure 7A:
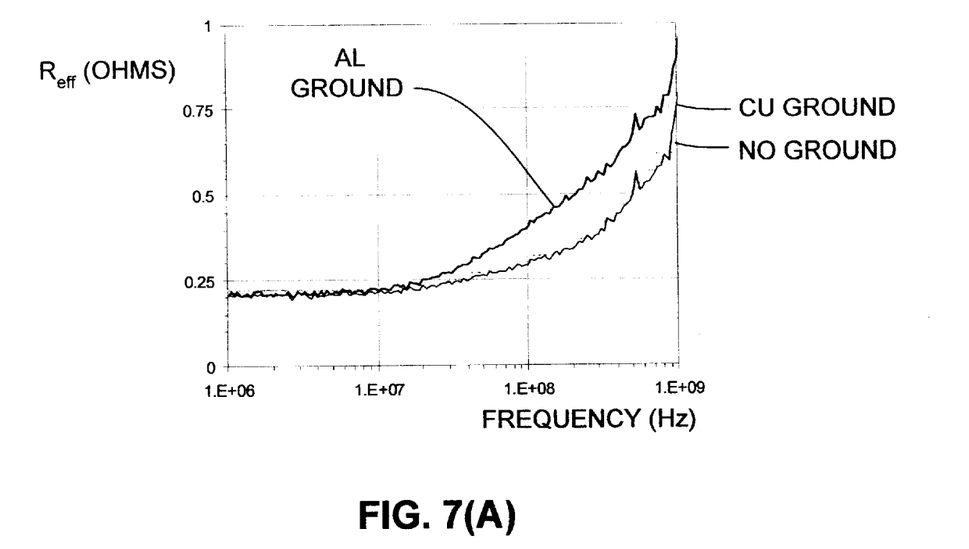
FIGS. 7(A) and 7(B) are graphs showing measurements taken in an experimental microcoil structure using various ground plane structures.
Figure 7B:
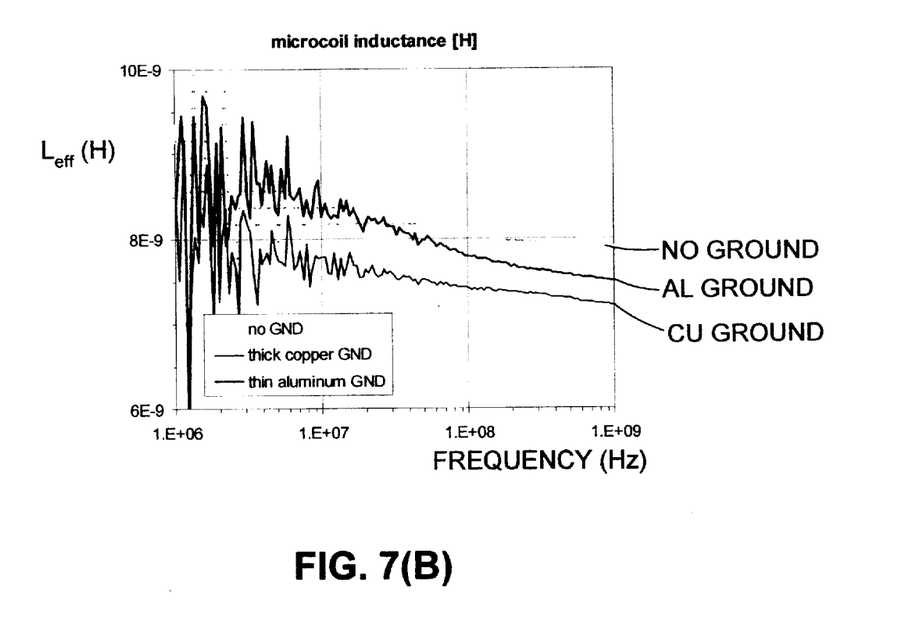

FIGS. 7(A) and 7(B) are graphs showing measurements of microcoil resistance $R_{eff}$ and microcoil inductance $L_{eff}$ taken in an experimental arrangement using a 4-turn microcoil structure, similar to microcoil structure 130-1 (FIG. 1), which was formed on a quartz substrate, and with thick and thin metal planes held in very close proximity and in parallel with the microcoil axis to mimic substrate coupling. Measurements for a thick copper ground plane (CU PLANE) were performed using a copper-clad FR4 board. Measurements for a thin aluminum ground plane (AL GROUND) were taken using aluminum having a thickness of 450 nm and sputtered on a silicon substrate (approx. 70 mΩ/square). As illustrated in the various measurements in FIG. 7(A) and FIG. 7(B), the eddy currents in a thick copper ground produce a lower effective coil inductance $L_{eff}$ over the entire frequency range as predicted by equation (2') and the effective resistance is like a no ground plane arrangement according to equation (1'). Otherwise stated, $R_{sub}$ is negligible compared to ω.L in expressions (1) and (2) regardless the frequency. The 70 mΩ/square, 450 nm aluminum ground plane only cuts the inductance at higher frequencies, as described by equation (2), and does increase the effective resistance according to equation (1). Accordingly, the present inventors determined that, in cases where the microcoils are integrated on an active IC substrates, the circuit top metal (which, in standard CMOS processes is typically 50 mΩ/square) will most often be too resistive for a ground plane structure that attempts to avoid eddy dissipation by minimizing the substrate resistance value $R_{sub}$. Note that this restriction does not apply to ground plane structures, such as ground plane structure 150 (discussed above), which are located under the base pads for purposes of reducing capacitive coupling. A 70 mΩ/square plane will efficiently short the substrate resistances $R_{i(i\pm 1)}$.

Figures 8, 9:
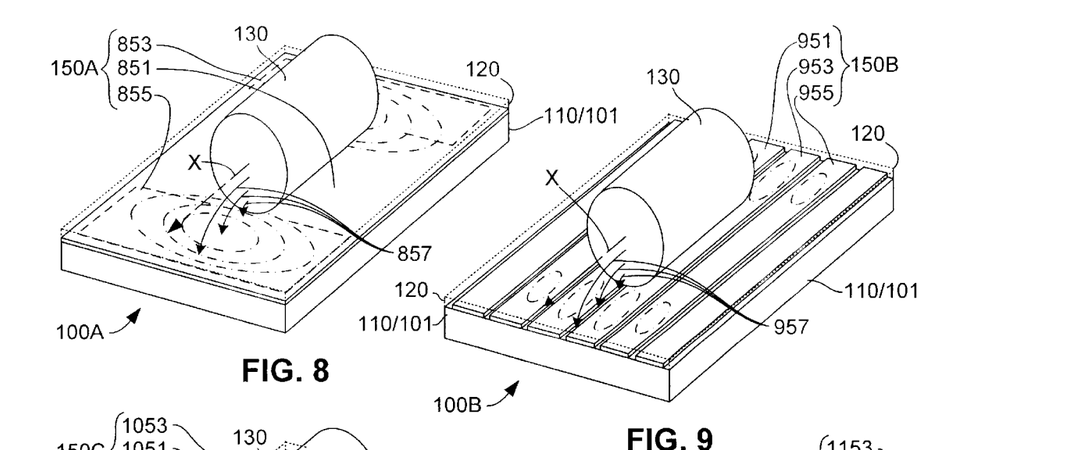
FIG. 8 is a perspective view showing a simplified IC device including a solid ground plane structure according to yet another embodiment of the present invention.
FIG. 9 is a perspective view showing a simplified an out-of-plane IC device including a slotted ground plane structure according to yet another embodiment of the present invention.

FIG. 8 is a perspective view showing a simplified IC device 100A including a microcoil structure 130 and a solid ground plane structure 150A according to a specific embodiment of the present invention. Microcoil structure 130 is formed, for example, using any of the out-of-plane coil production techniques described herein. Solid ground plane structure 150A is formed by a solid sheet of copper or other low-resistance metal formed to a suitable thickness (e.g., Cu having a thickness of approximately 5 microns or thicker) that is deposited (e.g., sputtered) over the upper passivation layer of IC substrate 110/101. Dielectric layer 120 is then completed by forming a dielectric film (e.g., BCB) on solid ground plane 150A, and microcoil structure 130 is then formed on dielectric layer 120. Note that solid ground plane structure 150A is roughly divided into three parts: a central section 851 located under and along each side of microcoil structure 130, a first end section 853 located outside a loop structure at a first end of microcoil structure 130, and a second end section 855 located outside the end loop structure at a second (opposite) end of microcoil structure 130. Similar to the ground plane structure 150 (described above), central section 851 of solid ground plane structure 150A is located underneath microcoil structure 130 to control the capacitive substrate coupling. In addition, end sections 853 and 855 intercept eddy current pathways 857, which are generated by microcoil structure 130, thereby reducing eddy currents in the conductors of IC substrate 110/101 located under end sections 853 and 855. Although not shown, one or more loop structures of microcoil structure 130 (e.g., the end loop structures) are connected to IC substrate 110/101 by conductors extending through openings formed in solid ground plane structure 150A. In other embodiments, internally located loop structures may be connected to IC substrate 110/101, and/or one or more loop structures may be connected to ground plane structure 150A.

FIG. 9 is a perspective view showing a simplified IC device 100B including a microcoil structure 130 and a slotted ground plane structure 150B according to another specific embodiment of the present invention. Similar to solid ground plane structure 150A (discussed above), slotted ground plane 150B is formed from a single layer of low resistance metal (e.g. copper) that is located between IC substrate 110/101 and a dielectric film of dielectric layer 120. However, slotted ground plane structure 150B is etched to form multiple segments (e.g., segments 951, 953, and 955) that extend parallel to microcoil axis X. Referring briefly to FIG. 8, eddy current pathways 857 produced by microcoil structure 130 have relatively large loop sizes due to the solid end sections 853 and 857, which causes a relatively large inductance $L_{sub}$ and their mutual inductance M with microcoil structure 130. Referring again to FIG. 9, slotted ground plane structure 150B reduces the loop sizes of eddy current pathways by minimizing the longitudinal spacing of each slotted segment, thereby reducing inductance $L_{sub}$ and the mutual inductance M with microcoil structure 130. The inventors found through experimental analysis that microcoil performance was improved by increasing the slot pitch (e.g., one segment per 60 microns resulted in lower eddy current dissipation than one segment per 500 microns.). In one embodiment, each segment of slotted ground plane structure 150B is connected to an single ground source. In another embodiment, each segment is electrically isolated (floating).

Figures 10, 11:
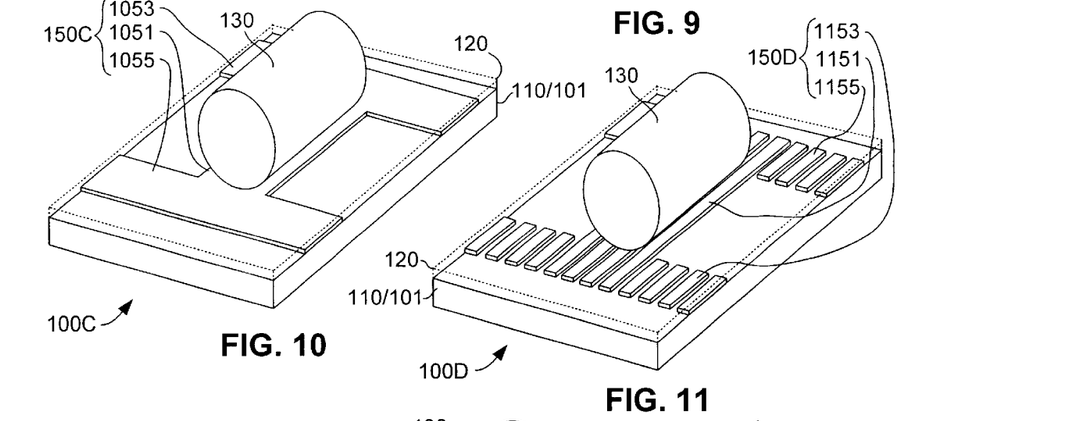
FIG. 10 is a perspective view showing a simplified IC device including an "I" shaped ground plane structure according to yet another embodiment of the present invention.
FIG. 11 is a perspective view showing a simplified IC device including a slotted "I" shaped ground plane structure according to yet another embodiment of the present invention.

FIG. 10 is a perspective view showing a simplified IC device 100C including an integral "I" shaped ground plane structure 150C according to yet another embodiment of the present invention. Similar to ground plane structure 150B (discussed above), "I" shaped ground plane 150C is formed by etching a single layer of low resistance metal (e.g. copper) that is located between IC substrate 110/101 and the dielectric film of dielectric layer 120. However, "I" shaped ground plane structure 150C is etched to form an "I" shape having a relatively narrow central section 1051 and relatively wide end sections 1053 and 1055, thereby implementing a ground structure only where its needed.

FIG. 11 is a perspective view showing a simplified IC device 100D including a slotted "I" shaped ground plane structure 150D according to yet another embodiment of the present invention. Slotted "I" shaped ground plane 150C is also formed from a single layer of low resistance metal (e.g., copper) that is located between IC substrate 110/101 and the dielectric film of dielectric layer 120. Further, slotted "I" shaped ground plane structure 150D forms a relatively narrow central section 1151 and relatively wide end sections 1153 and 1155, which are slotted in the manner described above to reduce eddy current loop sizes.

Figure 12:
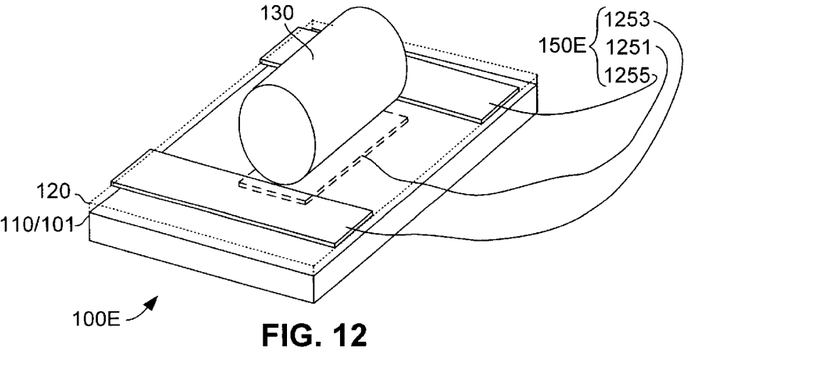
FIG. 12 is a perspective view showing a simplified IC device including a ground plane structure formed by multiple metal layers according to yet another embodiment of the present invention.

FIG. 12 is a perspective view showing a simplified IC device 100E including a multi-part, "I" shaped ground plane structure 150E according to yet another embodiment of the present invention. Ground plane structure 150E includes a central portion 1251 and separate end sections 1253 and 1255. Similar to ground plane structure 150 (described above), central portion 1251 is formed using a top metal layer of IC substrate 110/101 and located under the base pads of microcoil structure 130 in the manner described above to minimize the losses associated with the capacitive microcoil/substrate coupling. Conversely, end sections 1253 and 1255, which are formed on top of dielectric layer 120 and located outside of the end loops of microcoil structure 130 to minimize eddy current dissipation, are formed by metal portions used to produce microcoil structure 130. For example, when microcoil structure 130 is formed using a stress-engineered spring metal film (e.g., see microcoil structures 130-1 and 130-2, described above), then end sections 1253 and 1255 are formed from un-released plated portions of the stress-engineered spring metal film. Alternatively, when microcoil structure 130 is formed using bonding wires (e.g., see microcoil structure 130-3, described above), then end portions 1253 and 1255 are formed by the metal layer used to form the base pad traces 632. Note that end portions 1253 and 1255 may also be slotted in the manner described above. Accordingly, IC device 100E provides all of the benefits of the ground plane structures described above without requiring a separate metal formation step that is necessary when the ground plane structure is formed from a low-resistance metal layer located between IC substrate 110/101 and the dielectric film of dielectric layer 120.

Figure 13:
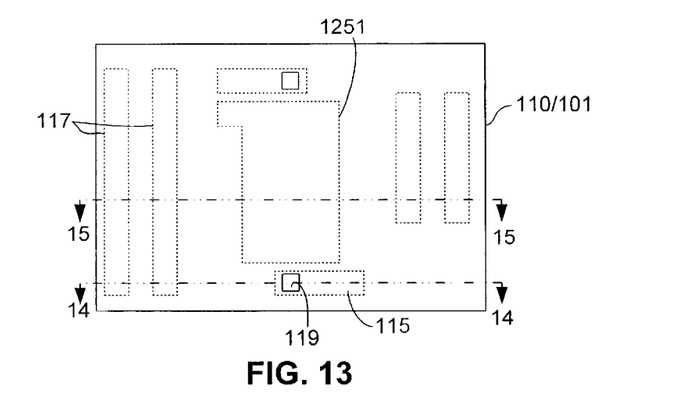
FIG. 13 is a top plan view showing an IC substrate at the beginning of the microcoil fabrication process according to another embodiment of the present invention.

FIGS. 13 through 21(E) show a general fabrication process utilized to produce IC device 100E (FIG. 12) according to another embodiment of the present invention. FIG. 13 is a top plan view showing an IC substrate 110/101 at the beginning of the microcoil fabrication process, and FIGS. 14(A) through 14(F) and 15(A) through 15(F) show cross-sectional side views taken along section lines 14—14 and 15—15, respectively, during early stages of the fabrication process. FIGS. 16 through 18(E) depict the formation of a spring mask and subsequent etching of a spring material layer to form islands of spring material. Finally, FIGS. 19 through 21(E) depict the formation of a release/plating mask and subsequent release and plating of the microcoil structure.

Figure 14A:
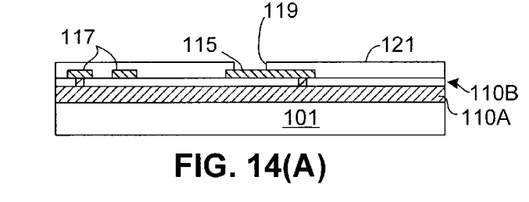
FIGS. 14(A) through 14(D) are cross-sectional side views taken along section line 14—14 of FIG. 13 during early stages of the fabrication process.
Figure 15A:
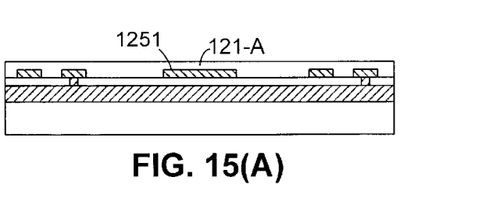
FIGS. 15(A) through 15(D) are cross-sectional side views taken along section line 15—15 of FIG. 13 during early stages of the fabrication process.

FIGS. 13, 14(A), and 15(A) are plan and cross-sectional side views showing IC substrate 110/101 at the beginning of the microcoil fabrication process. As indicated in FIG. 14(A), a metal layer 110B is formed over a lower IC layer 110A according to known techniques, and includes several conductors (wires) 117, which are drawn with greatly exaggerated dimensions for illustrative purposes. An opening 119 is formed in passivation layer 121 that exposes conductor/ wire 115, which serves as a contact point for the yet-to-be-formed microcoil structure. Note that central ground plane portion 1251 is formed from the same metal layer used to form conductors 117, and is therefore generated during the fabrication process used to form IC substrate 110/101. As shown in FIG. 15(A), passivation layer 121 includes a portion 121A that completely covers central ground plane portion 1251.

Figure 14B:
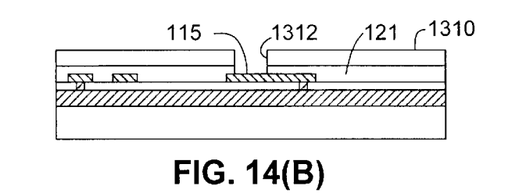
Figure 14C:
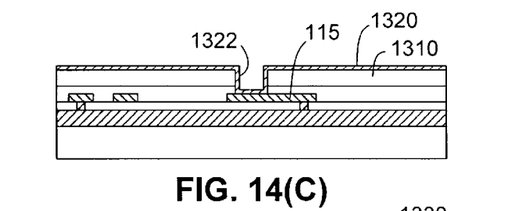
Figure 14D:
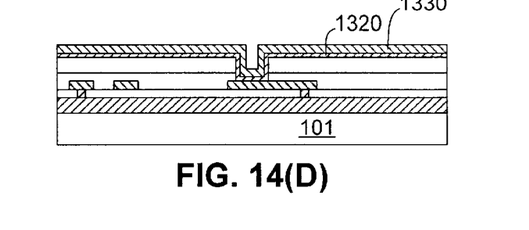
Figure 15B:
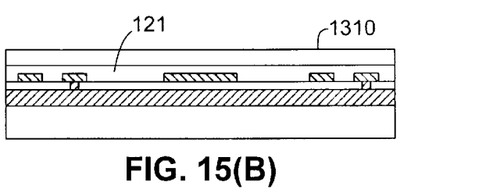
Figure 15C:
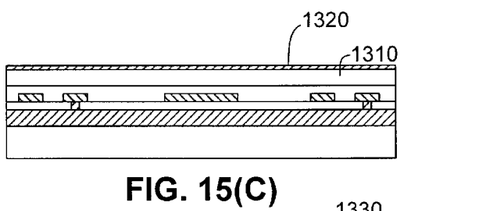
Figure 15D:
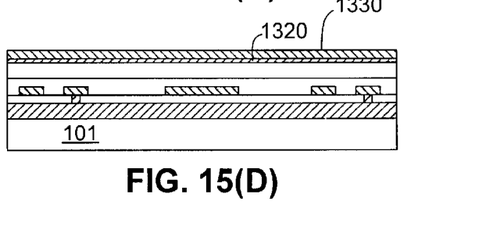

Referring to FIGS. 14(B) and 15(B), the microcoil production process begins by forming a dielectric layer 1310 over passivation layer 121, which is then patterned to provide an opening 1312 that exposes contacts 115. In one embodiment, dielectric layer 1310 comprises BCB formed to a thickness of 10 microns. Next, as shown in FIGS. 14(C) and 15(C), a conductive release material layer 1320 (e.g., titanium (Ti) having a thickness of 0.2 microns) is formed (e.g., sputtered) over dielectric layer 1310 such that a portion 1322 of the release material enters the openings formed over contact 115, thereby providing electrical contact between release material 1320 and contact 115. Next, as shown in FIGS. 14(D) and 15(D), a stress-engineered (spring) film 1330 is formed on release layer 1320 using known processing techniques such that film 1330 includes internal stress variations in the growth direction. For example, in one embodiment, spring material film 1330 is formed by varying the deposition chamber pressure such that its lowermost portions (i.e., adjacent to release material layer 1320) has a higher internal compressive stress than its upper portions, thereby forming internal stress variations that cause a bending bias away from wafer 101. Methods for generating such internal stress variations in spring material film 1330 are taught, for example, in U.S. Pat. No. 3,842,189 (depositing two metals having different internal stresses) and U.S. Pat. No. 5,613,861 (e.g., single metal sputtered while varying process parameters), both of which being incorporated herein by reference. In one embodiment, stress-engineered spring material film 1330 comprises a layered structure including a bottom Au layer later used as a plating seed layer, a central layer of molybdenum-chromium alloy (MoCr), and an upper Au layer, again used later as a plating seed layer, and having a total thickness of approximately 1 micron.

Figure 16:
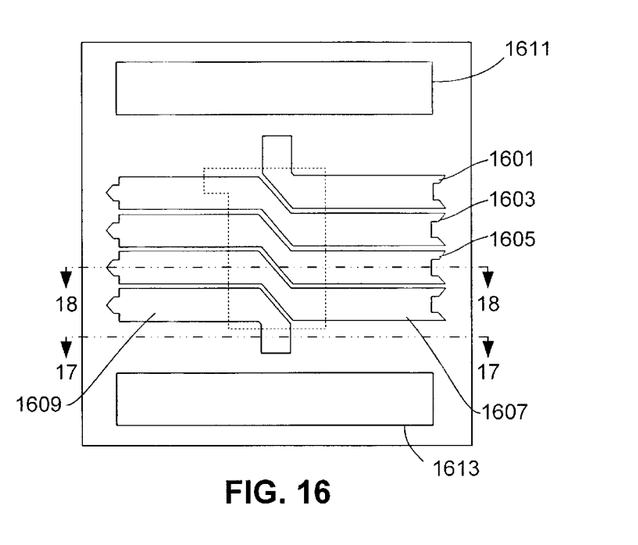
FIG. 16 is a plan view showing spring masks utilized in the fabrication process.
Figure 17A:
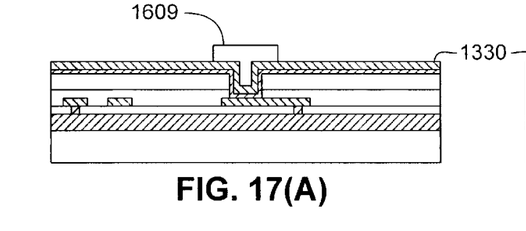
FIGS. 17(A) and 17(B) are cross-sectional side views taken along section line 17—17 of FIG. 16 during a spring metal etching stage of the fabrication process.
Figure 17B:
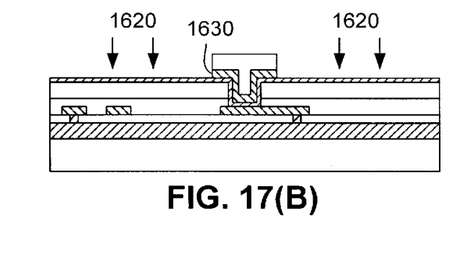
Figure 18A:
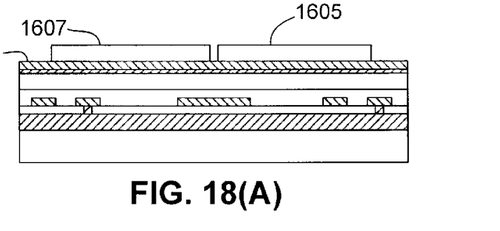
FIGS. 18(A) and 18(B) are cross-sectional side views taken along section line 18—18 of FIG. 16 during the spring metal etching stage of the fabrication process.
Figure 18B:
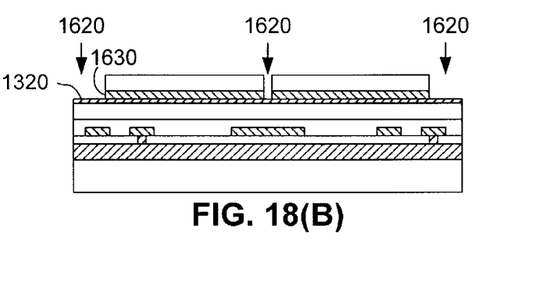

Referring to FIGS. 16, 17(A), and 18(A), a series of first (spring) masks 1601, 1603, 1605, 1607, and 1609 are then patterned over selected portions of spring material film 1330. Note that each spring mask is formed in the shape of a section of the completed microcoil structure, and may include a pointed tip at one end and a receiving notch at the other, as shown in FIG. 16. In addition, ground plane masks 1611 and 1613 are formed adjacent spring masks 1601 and 1609, respectively, which are used to form ground plane end sections 1253 and 1255 (described above with reference to FIG. 12). Next, as indicated in FIGS. 17(B) and 18(B), exposed portions of spring material film 1330 surrounding spring masks are etched using one or more etchants 1620 to form spring material islands 1630 under each mask. Rectangular sections of the spring material film are also retained at each end of spring metal islands 1620. Note that this etching process is performed such that limited etching occurs in release layer 1320 surrounding each spring material island 1630. In one embodiment, the etching step may be performed using, for example, a wet etching process to remove exposed portions of the spring material film. This embodiment was successfully performed using cerric ammonium nitrate solution to remove a MoCr spring metal layer. Subsequently, the spring metal masks and ground plane masks are removed.

Figures 19A, 19B:
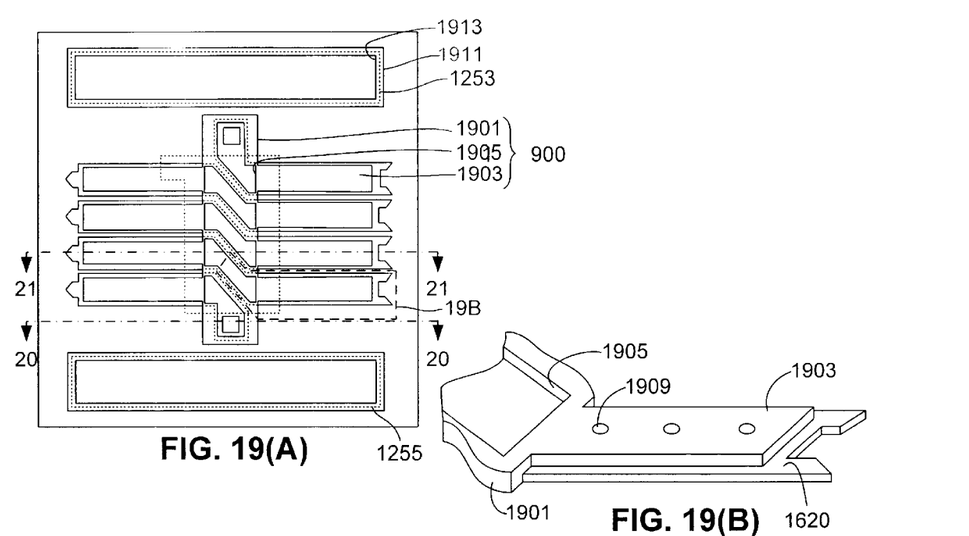
FIGS. 19(A) and 19(B) are plan and partial perspective views showing a release/plating mask utilized in the fabrication process.
Figure 20A:
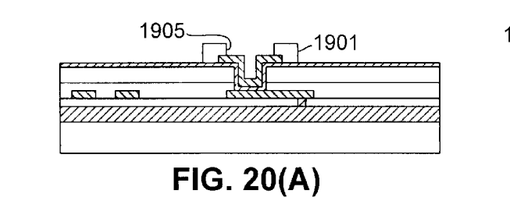
FIGS. 20(A) and 20(B) are cross-sectional side views taken along section line 20—20 of FIG. 19(A) during a spring metal release stage of the fabrication process.
Figure 21A:
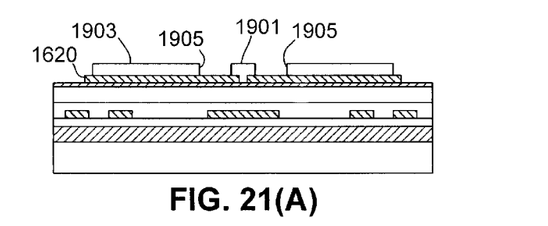
FIGS. 21(A) through 21(E) are cross-sectional side views taken along section line 21—21 of FIG. 19(A) during the spring metal release stage of the fabrication process.

FIGS. 19(A) and 19(B) are plan and partial perspective views showing a release/plating mask 1900 is then patterned over selected portions of spring material islands 1620. FIGS. 20(A) and 21(A) are cross-sectional side views showing the release/plating mask portions. Referring to FIG. 19(A), release/plating mask 1900 includes a central section 1901 covering central portions of spring material islands 1620, and elongated sections 1903 formed along a central portion of each elongated arm such that the edges of each elongated arm are exposed. The purpose of central section 1901 is to prevent release of the base pad portions of each loop structure. Elongated sections 1903 are utilized to control the spring assembly process, as described below. A series of openings 1905 are defined over the upper surface of each spring material island 1620 over the central section for plating purposes, as described below. Finally, a series of optional openings 1909 are formed through elongated sections 1903 and the underlying spring metal material to facilitate the release process.

Referring again to FIG. 19(A), a separate ground plane mask 1911 is formed over each ground plane section 1253 and 1255. Similar to the release/plating mask, ground plane mask 1911 defines an opening 1913 that exposes an upper surface of each ground plane section 1253 and 1255 while masking the edge thereof to prevent the release of ground plane sections 1253 and 1255 from the underlying substrate during the release process, which is described next.

Figure 20B:
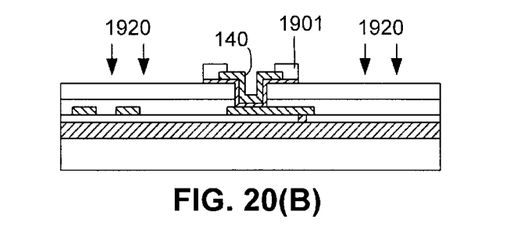
Figure 21B:
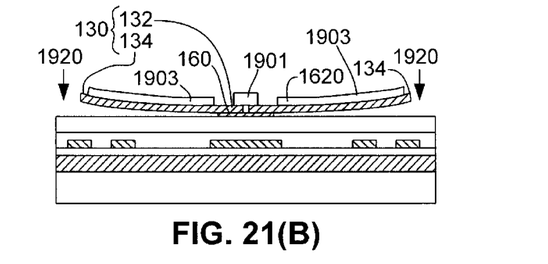

Referring to FIGS. 20(B) and 21(B), a release etchant 1920 (e.g., TFT titanium etch manufactured by Transcene Co. of Danvers, Mass., USA) is then use to selectively remove a portion of the release material layer from beneath the exposed portions of the spring material islands to form spring structures 130. As indicated in FIG. 21(B), each spring structure includes a base pad 132 secured to the underlying substrate by a release material portion 160, which is protected during the release process by release/plating mask 1901, and one or two arms 134 that are maintained in a partially bent state due to a counteracting stress generated by elongated mask sections 1903.

Figure 21C:
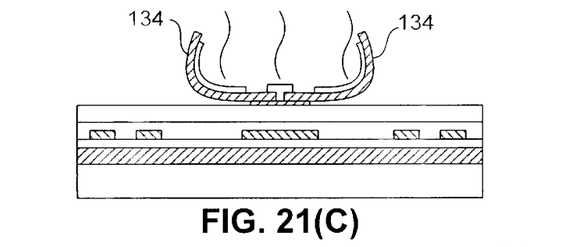
Figures 21D, 21E:
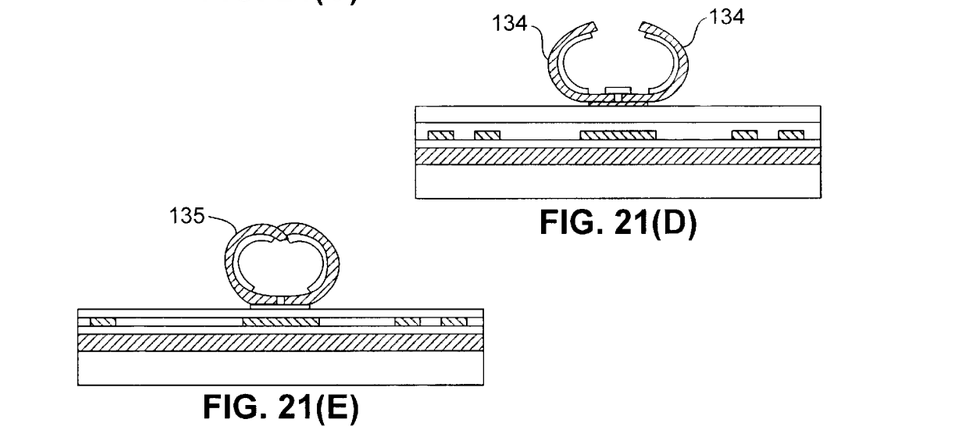

FIGS. 21(C) through 21(E) illustrate final stages of the release process during which elongated mask portions 1901 are heated or treated with acetone, thereby causing the internal stress of the arms 134 to overcome the counteracting stress, and to gradually bend into a loop structure 135. Finally, a plating process is performed (not shown) that forms plating 137 (e.g., copper) on the exposed portions of loop structure 135, as indicated in. FIG. 1. Note also that this plating process forms plating on the exposed portions of ground plane section 1253 and 1255.

Although the present invention has been described with respect to certain specific embodiments, it will be clear to those skilled in the art that the inventive features of the present invention are applicable to other embodiments as well, all of which are intended to fall within the scope of the present invention. For example, the present invention is applicable to both multi-loop microcoil structures, such as those specifically disclosed herein, and to single loop microcoil structures.

What is claimed is:

1. An IC device comprising:
   an integrated circuit fabricated on a semiconductor substrate;
   a dielectric layer formed over integrated circuit;
   a microcoil structure including:
      a plurality of spaced-apart base pads contacting the dielectric layer, and
      one or more loop structures extending over the dielectric layer, each loop structure having a first end contacting an associated first base pad and a second end contacting an associated second base pad; and a ground plane structure including a central portion located between the base pads of the microcoil structure and the integrated circuit, wherein the integrated circuit includes a voltage source, and wherein the ground plane structure is connected to the voltage source of the integrated circuit.

2. The IC device according to claim 1, wherein the integrated circuit further comprises a plurality of metal lines formed over a surface of the substrate, wherein the metal lines define a plane located between the substrate and the dielectric layer, and wherein the ground plane structure is located in said plane.

3. The IC device according to claim 2, wherein the ground plane structure comprises aluminum.

4. The IC device according to claim 2, wherein the ground plane structure comprises copper.

5. The IC device according to claim 2, wherein the ground plane structure has width that is smaller than a diameter defined by said one or more loop structures.

6. The IC device according to claim 1, wherein the base pads of the microcoil include a first end base pad and a second end base pad that are connected to the integrated circuit by respective via structures extending through the dielectric layer.

7. The IC device according to claim 1, wherein each of the loop structures is integrally connected at a fixed end to an associated base pad, and is curled in a helical fashion such that a free end of said loop structure contacts an adjacent base pad.

8. An IC device comprising:

an integrated circuit fabricated on a semiconductor substrate;

a dielectric layer formed over integrated circuit;

a microcoil structure including:

a plurality of spaced-apart base pads contacting the dielectric layer, and one or more loop structures extending over the dielectric layer, each loop structure having a first end contacting an associated first base pad and a second end contacting an associated second base pad; and a ground plane structure including a central portion located between the base pads of the microcoil structure and the integrated circuit, wherein the dielectric layer includes an upper passivation layer formed over the integrated circuit, wherein the ground plane structure comprises a low-resistance material located on the passivation layer, and wherein the dielectric layer further includes a dielectric film formed on the ground plane structure.

9. The IC device according to claim 8, wherein the low-resistance material comprises copper.

10. The IC device according to claim 8, wherein the ground plane structure has width that is smaller than a diameter defined by said one or more loop structures.

11. An IC device comprising:

an integrated circuit fabricated on a semiconductor substrate;

a dielectric layer formed over integrated circuit;

a microcoil structure including:

a plurality of spaced-apart base pads contacting the dielectric layer, and one or more loop structures extending over the dielectric layer, each loop structure having a first end contacting an associated first base pad and a second end contacting an associated second base pad; and a ground plane structure including a central portion located between the base pads of the microcoil structure and the integrated circuit, wherein each loop structure of the microcoil structure comprises a first arm integrally connected to a first base pad, and a second arm integrally connected to a second base pad, wherein a free end of the first arm is connected to a free end of the second arm over the first and second base pads.

12. The IC device according to claim 11, wherein the first base pad, first arm, second base pad, and second arm comprise a stress-engineered spring material.

13. An IC device comprising:

an integrated circuit fabricated on a semiconductor substrate;

a dielectric layer formed over integrated circuit;

a microcoil structure including:

a plurality of spaced-apart base pads contacting the dielectric layer, and one or more loop structures extending over the dielectric layer, each loop structure having a first end contacting an associated first base pad and a second end contacting an associated second base pad; and a ground plane structure including a central portion located between the base pads of the microcoil structure and the integrated circuit, wherein said plurality of base pads comprise traces including an elongated interconnect line extending between two contact pads, and wherein the loop structures comprise bonding wires extending between a first contact pad of a first trace and a second contact pad of a second trace.

14. An IC device comprising:

an integrated circuit fabricated on a semiconductor substrate;

a dielectric layer formed over integrated circuit;

a microcoil structure including:

a plurality of spaced-apart base pads contacting the dielectric layer, and one or more loop structures extending over the dielectric layer, each loop structure having a first end contacting an associated first base pad and a second end contacting an associated second base pad; and a ground plane structure including a central portion located between the base pads of the microcoil structure and the integrated circuit, wherein the one or more loop structures have center points defining an axis extending from a first end loop structure to a second end loop structure, and wherein the ground plane structure further comprises first and second end portions located outside of the first and second end loop structures, respectively, such that the microcoil structure is located between the first and second end loop structures.

15. The IC device according to claim 14, wherein the ground plane structure comprises a low-resistance metal layer formed between the integrated circuit and the dielectric layer.

16. The IC device according to claim 15, wherein the low-resistance metal layer comprises a plurality of segments extending parallel to the central axis.

17. The IC device according to claim 15, wherein the one or more loop structures define a diameter, and wherein the central section of the ground plane structure has a width that is smaller than the diameter defined by the loop structures.

18. The IC device according to claim 17, wherein the central section and the first and second end portions comprise a plurality of segments extending parallel to the central axis.

19. The IC device according to claim 14,
wherein the central section of ground plane structure comprises a first metal structure formed from an upper metal layer of the integrated circuit, and
wherein the first and second end portions comprise second metal structures formed over the first metal structure.

20. The IC device according to claim 19, wherein the second metal structures comprise a low-resistance metal layer formed between the integrated circuit and the dielectric layer.

21. The IC device according to claim 19, wherein the second metal structures comprise a metal layer formed on the dielectric layer.

* * * * *